United States Patent
D'Abreu et al.

(10) Patent No.: US 9,362,003 B2
(45) Date of Patent: Jun. 7, 2016

(54) SYSTEM AND METHOD TO DECODE DATA SUBJECT TO A DISTURB CONDITION

(75) Inventors: Manuel Antonio D'Abreu, El Dorado Hills, CA (US); Stephen Skala, Fremont, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 268 days.

(21) Appl. No.: 13/416,138

(22) Filed: Mar. 9, 2012

(65) Prior Publication Data

US 2013/0238955 A1 Sep. 12, 2013

(51) Int. Cl.
G11C 29/04 (2006.01)
G06F 11/10 (2006.01)

(52) U.S. Cl.
CPC ............ G11C 29/04 (2013.01); G06F 11/1048 (2013.01)

(58) Field of Classification Search
CPC .............................. G11C 29/04; H04L 1/0054
See application file for complete search history.

(56) References Cited

U.S. PATENT DOCUMENTS

| | | | |
|---|---|---|---|
| 6,405,342 B1 * | 6/2002 | Lee | 714/792 |
| 6,694,477 B1 * | 2/2004 | Lee | 714/784 |
| 7,212,456 B2 | 5/2007 | Callaway et al. | |
| 7,934,130 B2 | 4/2011 | Reid | |
| 7,966,518 B2 | 6/2011 | Bosch et al. | |
| 8,117,519 B2 * | 2/2012 | Ito et al. | 714/764 |
| 2005/0073884 A1 * | 4/2005 | Gonzalez et al. | 365/185.02 |
| 2010/0195384 A1 * | 8/2010 | Sharon et al. | 365/185.02 |
| 2010/0235715 A1 * | 9/2010 | Thatcher et al. | 714/763 |

FOREIGN PATENT DOCUMENTS

WO 2011094051 A1 8/2011

OTHER PUBLICATIONS

International Search Report and Written Opinion mailed Jun. 27, 2013 in International Application No. PCT/US2013/028275, 8 pages.
International Preliminary Report on Patentability issued Sep. 9, 2014 in International Application No. PCT/US2013/028275, 5 pages.

* cited by examiner

*Primary Examiner* — Steve Nguyen
(74) *Attorney, Agent, or Firm* — Toler Law Group, PC (57) ABSTRACT

A method includes initiating a first decode operation of data at an error correction code (ECC) hard bit decoder in a data storage device that includes a controller and a memory. The method further includes, in response to the first decode operation indicating that the data is uncorrectable by the first decode operation, identifying one or more bits of the data that correspond to a disturb condition test pattern, changing a value of the one or more identified bits of the data to generate modified data, and initiating a second decode operation at the ECC hard bit decoder using the modified data.

28 Claims, 3 Drawing Sheets

SYSTEM AND METHOD TO DECODE DATA SUBJECT TO A DISTURB CONDITION

FIELD OF THE DISCLOSURE

The present disclosure is generally related to decoding data that is subject to a disturb condition.

BACKGROUND

Non-volatile memory devices, such as universal serial bus (USB) flash memory devices or removable storage cards that hold data between power cycles, have allowed for increased portability of data and software applications. As process advances enable smaller physical dimensions of memory cells, physical effects such as coupling between floating gates of transistors of neighboring cells become more pronounced. Under certain circumstances, a read operation or a write operation at one memory cell may affect a charge level that is read from an adjacent memory cell. When a number of errors in a word line exceeds an error correction capacity for a data storage device, data stored at the word line may be lost.

SUMMARY

Systems and methods to decode data stored on a data storage device are disclosed. One or more bits of data read from a particular memory cell may be changed based on identifying the one or more bits of data as corresponding to a disturb condition test pattern. The disturb condition test pattern may be based at least in part on a state of one or more neighbor memory cells to the particular memory cell. For example, states of the neighbor memory cells may be compared to one or more patterns that correspond to the particular memory cell being prone to a disturb error that may be caused by a read operation or a write operation to one or more of the neighbor cells.

DETAILED DESCRIPTION

Figure 1:
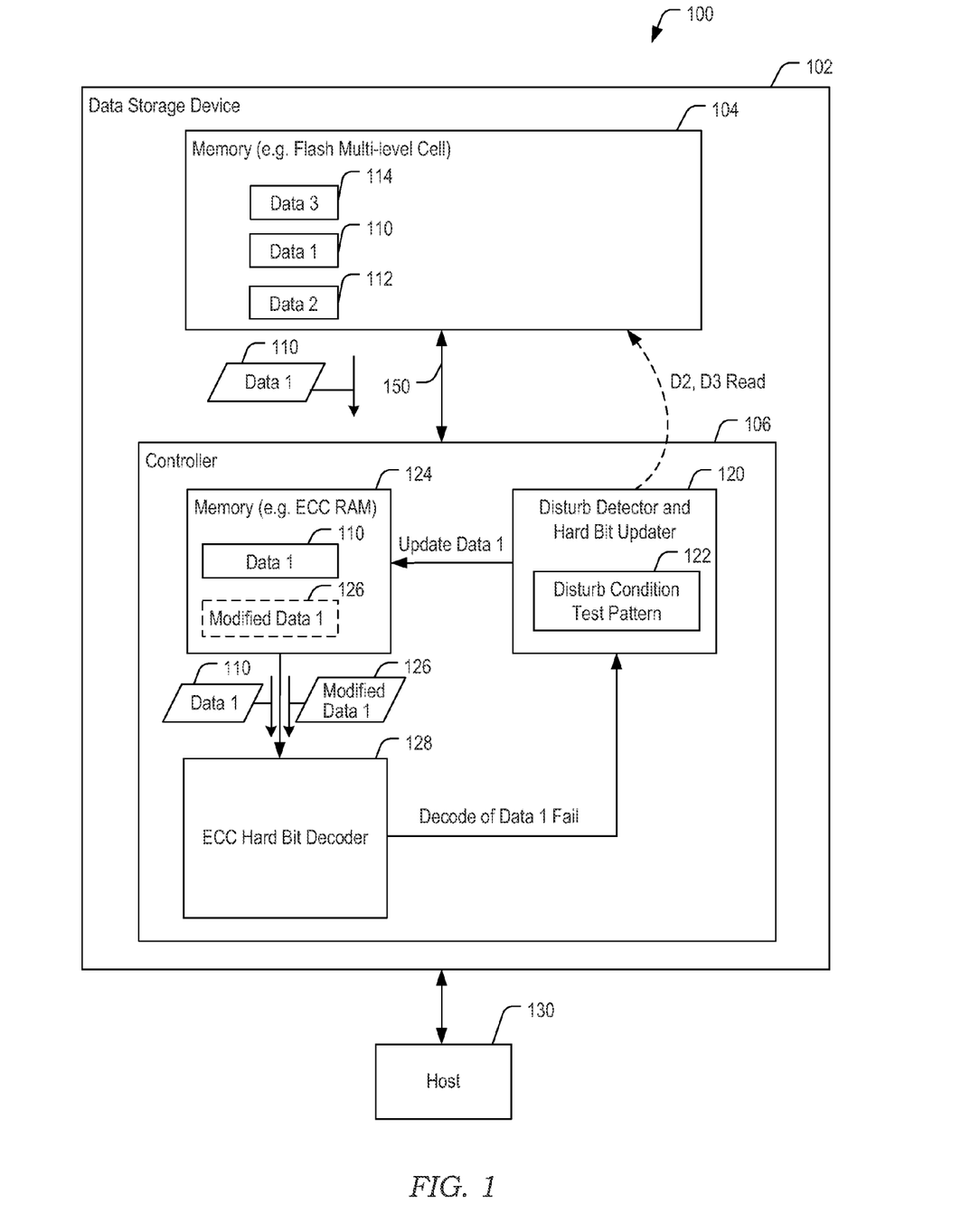
FIG. 1 is a block diagram of an illustrative embodiment of a system to decode data that is subject to a disturb condition.

Referring to FIG. 1, a particular embodiment of a system to decode data that is subject to a disturb condition is depicted and generally designated 100. The system 100 includes a data storage device 102 coupled to a host device 130. The data storage device 102 includes a memory 104 coupled to a controller 106 via a bus 150.

The host device 130 may be configured to provide data to be stored at the memory 104 or to request data to be read from the memory 104. For example, the host device 130 may include a mobile telephone, a music or video player, a gaming console, an electronic book reader, a personal digital assistant (PDA), a computer such as a laptop computer, a notebook computer, or a tablet, any other electronic device, or any combination thereof.

The data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be embedded memory in the host device 130, such as eMMC® (trademark of JEDEC Solid State Technology Association, Arlington, Va.) and eSD memory, as illustrative examples.

The memory 104 may be a non-volatile memory of a flash device, such as a NAND flash device, a NOR flash device, or any other type of flash device. The memory 104 includes data, such as representative first data (data 1) 110, representative second data (data 2) 112, and representative third data (data 3) 114. The first data 110 may correspond to data stored in a first word line in the memory 104, the second data 112 may correspond to data stored in a second word line in the memory 104, and the third data 114 may correspond to data stored in a third word line in the memory 104, as described in further detail with respect to FIG. 2.

The controller 106 may be configured to receive memory access requests from the host device 130 and to process data read from the memory 104. The controller 106 includes a disturb detector/hard bit updater 120, a memory 124, and an error correction code (ECC) hard bit decoder 128. The memory 124 may be a random access memory (RAM), such as an ECC RAM.

The controller 106 may be configured to provide data read from the memory 104 to the ECC hard bit decoder 128. In response to a decoding failure, the controller 106 may be configured to initiate a read operation at one or more neighbor memory cells of each memory cell that stores the data. The controller 106 may determine which neighbor memory cells to read based on known correlations related to disturb mechanisms such as, for example, program disturb conditions, read disturb conditions, other disturb conditions, or any combination thereof.

For example, offline studies may determine correlations between the readings of certain cells and an associated set of other cells. Alternatively or in addition, physical models may be used to determine correlations between the readings of certain cells and an associated set of other cells. The locations of the other cells that are correlated to program disturbs or read disturbs at the certain cells may be recorded and stored or encoded at the controller 106. To illustrate, the offline study or physical model may indicate that memory cells sharing a bit line with a particular cell and within four word lines of the particular cell may be sufficiently coupled to the particular cell such that a write operation may affect the state of the particular cell. Such a disturbance to the state of the particular cell due to a write operation occurring at another cell is referred to as a "program disturb," "programming disturb," and "programming-time disturb." As another illustration, the offline study or physical model may indicate that memory cells sharing a bit line with a particular cell and within four word lines of the particular cell may be sufficiently coupled to the particular cell such that a read operation (or repeated read operations) may affect the state of the particular cell. Such a disturbance to the state of the particular cell due to a read operation occurring at another cell may be referred to as a "read disturb," "reading disturb," and "reading-time disturb."

In addition to potentially identifying memory cells sharing a same bit line as sufficiently coupled to the particular cell to cause a program disturb or read disturb, as another illustrative, non-limiting example, the offline study or physical model may indicate that the two nearest memory cells sharing the same word line of the particular cell, or the four diagonally adjacent cells at adjacent word lines and bit lines, or any combination thereof, may be sufficiently coupled to the particular cell to cause a program disturb or a read disturb. Memory cells that are determined to be sufficiently coupled to the particular cell to potentially cause a disturb condition at the particular cell as a result of a data write or read operation are referred to as "neighbor cells." Although referred to as "neighbor," such cells need not be physically adjacent to the particular cell and may instead be at any location within the memory array 104. For example, a neighbor cell may be at any location within a same block as the particular cell.

The controller 106 may be configured to initiate a first decode operation of data at the ECC hard bit decoder 128. For example, the memory 124 may be configured to store data read from the memory 104. To illustrate, the memory 124 may store the first data 110 read from the memory 104. The first data 110 may correspond to data read from a page of a word line of the memory 104 and may include one or more bits of data read from a particular memory cell of the page of the word line of the memory 104. The ECC hard bit decoder 128 may be configured to perform a decode operation on data received from the memory 124. For example, the ECC hard bit decoder 128 may perform a first decode operation on the first data 110 received from the memory 124.

In response to the first decode operation indicating that the data is uncorrectable by the first decode operation, the controller 106 may be configured to initiate identification of one or more bits of the data that correspond to a disturb condition test pattern 122, initiate changing a value of the one or more identified bits of the data to generate modified data 126, and initiate a second decode operation at the ECC hard bit decoder 128 using the modified data 126.

The ECC hard bit decoder 128 may be a Reed Solomon ECC hard bit decoder, a Bose-Chaudhuri-Hocquenghem (BCH) ECC hard bit decoder, a low-density parity-check ECC hard bit decoder, one or more other ECC hard bit decoders, or any combination thereof. The ECC hard bit decoder 128 may generate an indication, such as a first decode of data fail ("decode of data 1 fail") indication, indicating that the first data 110 is uncorrectable by the first decode operation.

The disturb detector/hard bit updater 120 may be configured to apply one or more of the disturb condition test patterns 122 to locate bits likely to be subject to a disturb condition. For example, in response to receiving the first decode of data fail indication, the disturb detector/hard bit updater 120 may be configured to identify one or more bits of the first data 110 that correspond to the disturb condition test pattern 122. The disturb condition test pattern 122 may be stored at the disturb detector/hard bit updater 120 and may include one or more disturb patterns. For example, the disturb condition test pattern 122 may include one or more program disturb patterns. Alternatively or in addition, the disturb condition test pattern 122 may include one or more read disturb patterns. For example, the disturb condition test pattern 122 may represent state values of neighbor cells that have been determined to correspond to a disturb condition at the particular cell based at least in part on the correlations between the readings of certain cells and an associated set of other cells as described above.

After identifying one or more bits of the first data 110 that correspond to the disturb condition test pattern 122, the disturb detector/hard bit updater 120 may be configured to change a value of the one or more identified bits of the first data 110 to generate the modified data 126. For example, first update data ("update data 1") may be generated by the disturb detector/hard bit updater 120 by changing or "flipping" the one or more identified bits of the first data 110. After the one or more identified bits of the first data 110 are changed or "flipped", the first update data may be received by the memory 124. The first update data may overwrite the first data 110 to form the modified data 126. Alternatively, the first update data may be stored separately from the first data 110 to form the modified data 126. A second decode operation may be performed at the ECC hard bit decoder 128 using the modified data 126.

In the event that the second decode operation at the ECC hard bit decoder 128 determines that the modified data 126 is uncorrectable, the controller 106 may be configured to read other data, such as the states of neighboring memory cells, the second data 112, the third data 114, or any combination thereof, and additional modified data 126 may be generated until an ECC decode operation is successful. For example, if the second decode operation is based on the states of neighboring memory cells that are in a same page and adjacent to a particular memory cell that contains the one or more identified bits, and the second decode operation at the ECC hard bit decoder 128 determines that the modified data 126 is uncorrectable, a subsequent read of states from other neighboring memory cells to the particular memory cell may enable the controller 106 to successfully decode data read from the memory 104. For example, the states of neighboring memory cells adjacent to and in different pages than the particular memory cell may be compared to the disturb condition test pattern 122. As another example, the states of neighboring memory cells in different word lines than the word line that contains the particular memory cell may be compared to the disturb condition test pattern 122. Alternatively, the controller 106 may impose a limit to a number of successive ECC decode operations that may be attempted. For example, the limit may be associated with an ECC operation threshold, such as a predetermined number of ECC operations or a timeout.

During operation, a memory read request may be received from the host device 130 at the controller 106 to read data from the memory 104, such as data from a word line of the memory 104 (e.g., the first data 110). Data from a page of the word line may be read and may include one or more bits of data read from a particular memory cell of the page of the word line of the memory 104 and provided by the controller 106 to the ECC hard bit decoder 128. The ECC hard bit decoder 128 may perform a first decode operation of the read first data 110. In response to the first decode operation indicating that the first data 110 is uncorrectable by the first decode operation, the disturb detector/hard bit updater 120 may identify one or more bits of the first data 110 that correspond to the disturb condition test pattern 122 and may change a value of the one or more identified bits of the first data 110 to generate the modified data 126. A second decode operation may be performed at the ECC hard bit decoder 128 using the modified data 126.

By identifying bits that correspond to a disturb condition test pattern as likely to be erroneous after performing a first decode operation, the controller 106 may correct a sufficient number of erroneous bits in a subsequent decode operation to enable the controller 106 to successfully decode data read from the memory 104. To illustrate, in the event that the first decode operation determines that the data (e.g., the data read from a word line) is uncorrectable, the states of neighboring memory cells may be compared to the disturb condition test pattern 122 and the modified data 126 may be generated based on the disturb condition test pattern 122 until a decode operation at the ECC hard bit decoder 128 is successful. For example, the controller 106 may be configured to compare the state value of a particular memory cell and the state values of neighboring memory cells to the disturb condition test pattern 122. Based on the comparison, the controller 106 may be configured to identify a bit error of the data corresponding to the particular memory cell as corresponding to the disturb condition test pattern and generate the modified data 126 by changing a value of one or more identified bits of the data in the particular memory cell. Alternatively, the controller 106 may impose a limit to a number of successive decode operations that may be attempted based on the modified data 126. For example, the limit may be associated with a decode operation threshold, such as a predetermined number of decode operations or a timeout.

Figure 2:
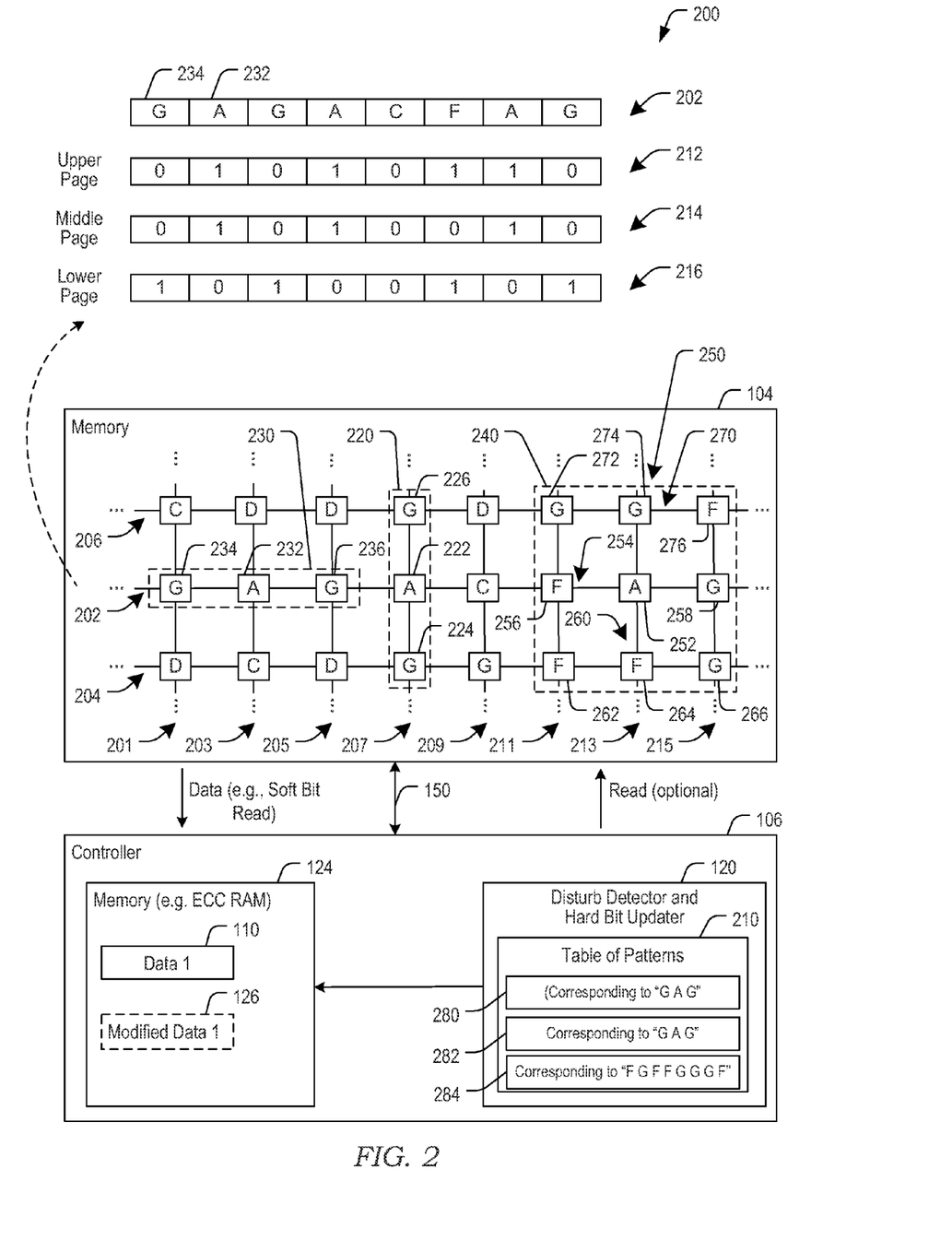
FIG. 2 is a diagram illustrating additional detail of a memory and of a controller of the system of FIG. 1.

Referring to FIG. 2, a particular illustrative embodiment of the system of FIG. 1 showing additional detail of the memory 104 and the controller 106 is depicted and generally designated 200. The system 200 includes the memory 104 coupled to the controller 106 via the bus 150.

The memory 104 includes representative word lines 202, 204, and 206. The memory 104 also includes representative bit lines 201, 203, 205, 207, 209, 211, 213, and 215. Representative memory storage elements or cells are depicted at intersections of word lines and bit lines, such as memory cells 222, 224, and 226 coupled to the bit line 207, memory cells 256, 262, and 272 coupled to the bit line 211, memory cells 252, 264, and 274 coupled to the bit line 213, memory cells 258, 266, and 276 coupled to the bit line 215, and memory cells 232, 234, and 236 coupled to the bit lines 203, 201, and 205, respectively. The memory 104 may also include groups of memory cells that correspond to particular disturb condition test patterns. For example, a first group of memory cells 220 may correspond to a first disturb condition test pattern, a second group of memory cells 230 may correspond to a second disturb condition test pattern, and a third group of memory cells 240 may correspond to a third disturb condition test pattern.

A group of memory cells may include multiple multi-level cell (MLC) memory cells. Each memory cell may have a threshold voltage corresponding to a state of the memory cell (e.g., a predefined state corresponding to a particular range of threshold voltage values). The state of each memory cell may correspond to data stored at the memory cell. The data stored at a memory cell may be read by comparing the threshold voltage to one or more read thresholds.

Each memory cell may store multiple bits per memory cell, such as 3-bits per cell. For example, data stored at each memory cell may include a bit of an upper page 212, a bit of a middle page 214, and a bit of a lower page 216. To illustrate, the word line 202 is shown in detail, where the memory cell 234 may include data having a value of "0" stored in the upper page 212, a value of "0" stored in the middle page 214, and a value of "1" stored in the lower page 216, corresponding to a value of "0 0 1". Similarly, the memory cell 232 may include data having a value of "1" stored in the upper page 212, a value of "1" stored in the middle page 214, and a value of "0" stored in the lower page 216, corresponding to a value of "1 1 0".

Each memory cell may be programmed to one of multiple predefined states. For example, a 3-bit cell may have a set of possible states "Er" (erase), "A", "B", "C", "D", "E", "F", and "G". Each of the predefined states may be mapped to a particular bit value. To illustrate, the memory cell 232 may store a bit value of "1 1 0" corresponding to state "A" and the memory cell 234 may store the bit value "0 0 1" corresponding to state "G". The bit value that corresponds to the determined MLC state is referred to as "hard bit(s)". Additional information that can be used to indicate a reliability of the reading of a memory cell is referred to as "soft bit(s)".

The controller 106 includes the memory 124 and the disturb detector/hard bit updater 120. The memory 124 may be configured to receive the first data 110 and the modified data 126. The disturb detector/hard bit updater 120 includes a table of patterns 210. The table of patterns 210 includes a first disturb condition test pattern 280 corresponding to the first group of memory cells 220, a second disturb condition test pattern 282 corresponding to the second group of memory cells 230, and a third disturb condition test pattern 284 corresponding to the third group of memory cells 240. The controller 106 may be configured to select one or more of the first, second, and third disturb condition test patterns 280-284 from the table of patterns 210. Although the table of patterns 210 is illustrated as within the controller 106, in other implementations, the table of patterns 210 may instead be within the memory 104 of the data storage device 102.

During operation, the controller 106 may receive a data read request from the host device 130 of FIG. 1 and may initiate a read operation to read data from the memory 104. For example, the controller 106 may receive a data read request from the host device 130 to read data from the word line 202. To illustrate, data from the middle page 214 of the word line 202 may be read and provided by the controller 106 to the ECC hard bit decoder 128 of FIG. 1. The ECC hard bit decoder 128 may perform a first decode operation of the data read from the middle page 214. In response to the first decode operation indicating that the data read from the middle page 214 is uncorrectable by the first decode operation, an error correction operation may be performed that may include a second read operation of the memory 104. For example, the second read operation may include reading the states of neighbor cells to a particular cell in the middle page 214, where the particular cell is identified as likely to include erroneous bit values. Alternatively, the second read operation may include reading soft bits from a neighbor cell adjacent to and in a same word line as the particular cell.

The data read by the second read operation may be provided by the controller 106 to the ECC hard bit decoder 128. The ECC hard bit decoder 128 may perform another decode operation of the data read by the second read operation. In response to the other decode operation indicating that the data read from the second read operation is uncorrectable by the other decode operation, the disturb detector/hard bit updater 120 may identify one or more bits of the data read from the second read operation that correspond to one of the disturb condition test patterns 280-284 and may change a value of the one or more identified bits of the data read from the second read operation to generate the modified data 126.

For example, when the second read operation includes reading the states of neighbor cells to a particular cell in the middle page 214, the controller 106 may initiate reads of one or more neighbor cells whose state value may be correlated to a disturb condition and may be used in comparison to one or more of the disturb condition test patterns 280-284. One or more of the disturb condition test patterns 280-284 may be based at least in part on a state of a second cell of the memory adjacent to a first cell of the memory, where the first cell stores one or more of the identified bits. For example, the controller 106 may read state values of cells sharing the same bit line 207 as the particular cell, state values of cells sharing the same word line 202 as the particular cell, or any combination thereof. For example, the first cell may be coupled to a first bit line and to a first word line, and the second cell may be coupled to the first bit line and to a second word line.

To illustrate, if the particular cell is identified as the memory cell 222, the controller 106 may read state values of cells sharing the same bit line 207 as the memory cell 222, such as a first state value (e.g., state "G") of the memory cell 224 at the intersection of the word line 204 and the bit line 207. Because program disturbance effects resulting from programming nearby cells may be most likely to occur in a lower voltage state, and read disturbance effects resulting from reading nearby cells may be most likely to occur in a higher voltage state, the first state value (e.g., "G"—a higher voltage state) of the memory cell 224 may affect the data stored in the memory cell 222 (e.g., "A"—a lower voltage state).

Alternatively, or in addition, the disturb condition test pattern may be based at least in part on a state of a third cell, where the third cell is adjacent to the first cell, where the third cell is coupled to the first bit line and to a third word line, and where the first word line is located between the second word line and the third word line. To illustrate, in addition to reading the first state value of the memory cell 224, the controller 106 may also read a state value (e.g., state "G") of the memory cell 226 at the intersection of the word line 206 and the bit line 207 to determine whether data read from the memory cell 222 is likely to be subject to a disturb condition.

The controller 106 may be configured to compare the state value of the memory cell 222 and the first state value of the memory cell 224 to one or more of the disturb condition test patterns 280-284, and based on the comparison, the controller 106 may be configured to identify a bit error of the data corresponding to the memory cell 222 as corresponding to a disturb condition test pattern. As another example, the controller 106 may be configured to perform a second comparison that compares the state value of the memory cell 222, the first state value of the memory cell 224, and the second state value of the memory cell 226, to one or more of the disturb condition test patterns 280-284. The controller 106 may be configured to change a value of the one or more identified bits based on the second comparison.

To illustrate, when the controller 106 performs the second read operation and reads the first state value of the memory cell 224, the controller 106 may also read a state value (e.g., state "G") of the memory cell 226 at the intersection of the word line 206 and the bit line 207. The first state value (e.g., "G"—a higher voltage state) of the memory cell 224 and the second state value (e.g., "G"—a higher voltage state) may affect the data stored in the memory cell 222 (e.g., "A"—a lower voltage state). Accordingly, a likelihood of erroneous data being stored in the memory cell 222 may be greater due to the higher voltage states of the one or more adjacent neighbor memory cells 224 and 226 as compared to the lower voltage state stored in the memory cell 222. If the one or more identified bits (e.g., a "0 1 1" value corresponding to the state "A") correspond to the first disturb condition test pattern 280 (e.g., a disturb condition test pattern corresponding to the states "G A G" in the lower, middle, and upper pages 204, 202, and 206, respectively), modified data may be generated by changing one or more of the identified bits (e.g., changing the "0 1 1" value corresponding to the state "A" to a "1 1 1" value corresponding to the state "Er"), and a second decode operation may be performed at the ECC hard bit decoder 128 of FIG. 1 using the modified data.

As another example, the second read operation may include reading soft bits from a neighbor cell adjacent to and in a same word line as the particular cell. For example, if the particular cell is identified as the memory cell 232, the controller 106 may initiate soft bit reads of one or more neighbor cells in the word line 202 whose state value may be correlated to a disturb condition and may be used in comparison to one or more of the disturb condition test patterns 280-284. For example, the controller 106 may also read soft bits of cells adjacent to and sharing the same word line 202 as the particular cell 232, such as the memory cell 234 and the memory cell 236. The memory cell 232 may be between the memory cell 234 and the other memory cell 236.

The controller 106 may be configured to compare the soft bits read from the memory cells 234, 236 to one or more of the disturb condition test patterns 280-284, and based on the comparison, may change a value of the one or more identified bits. For example, soft bits read from the memory cell 234 having the state "G" and soft bits read from the memory cell 236 having the state "G" may indicate that the data stored in the memory cell 232 (e.g., having a state "A"—a lower voltage state) may be affected by the neighbor cells 234, 236. A likelihood of erroneous data being stored in the memory cell 232 may be greater due to the higher voltage states of the one or more adjacent neighbor memory cells 234 and 236 as compared to the lower voltage state stored in the memory cell 232. If the one or more identified bits correspond to a disturb condition test pattern, such as the second disturb condition test pattern 282, modified data may be generated, and a second decode operation may be performed at the ECC hard bit decoder 128 of FIG. 1 using the modified data.

As another example, the disturb condition test pattern may be based at least in part on a state of one or more neighbor cells 250 to a specific cell 252 that stores one or more of the identified bits. The specific cell 252 may be coupled to a particular bit line (e.g., the bit line 213) and to a particular word line (e.g., the word line 202), and a first neighbor cell 262 of the one or more neighbor cells 250 may be coupled to a first neighbor bit line (e.g., the bit line 211) and to a first neighbor word line (e.g., the word line 204). Alternatively, or in addition, a second neighbor cell 276 of the one or more neighbor cells 250 may be coupled to a second neighbor bit line (e.g., the bit line 215) and to a second neighbor word line (e.g., the word line 206). The particular word line 202 may be located between the first neighbor word line 204 and the second neighbor word line 206, and the particular bit line 213 may be located between the first neighbor bit line 211 and the second neighbor bit line 215.

A first group 254 of the one or more neighbor cells 250 may include a first plurality of neighbor cells, such as the neighbor cells 256 and 258. The first group 254 of neighbor cells may be coupled to the particular word line 202. A second group 260 of the one or more neighbor cells 250 may include a second plurality of neighbor cells, such as the neighbor cells 262, 264, and 266, that includes the first neighbor cell 262. The second group 260 may be coupled to the first neighbor word line 204. A third group 270 of the one or more neighbor cells 250 may include a third plurality of neighbor cells, such as the neighbor cells 272, 274, and 276, that includes the second neighbor cell 276. The third group 270 may be coupled to the second neighbor word line 206.

The controller 106 may be configured to compare the state values of one or more of the neighboring cells 250 to one or more of the disturb condition test patterns 280-284, and based on the comparison, the controller 106 may be configured to change a value of the one or more identified bits. To illustrate, when the controller 106 reads the data stored in the specific cell 252 (e.g., data corresponding to the state value "A"), the controller 106 may also read data that corresponds to a state value of one or more of the neighbor cells 250. For example, the controller 106 may read data that corresponds to the state value "F" stored in the memory cell 256, data that corresponds to the state value "G" stored in the memory cell 258, data that corresponds to the state value "F" stored in the memory cell 262, data that corresponds to the state value "F" stored in the memory cell 264, data that corresponds to the state value "G" stored in the memory cell 266, data that corresponds to the state value "G" stored in the memory cell 272, data that corresponds to the state value "G" stored in the memory cell 274, and data that corresponds to the state value "F" stored in the memory cell 276, or any combination thereof.

The neighbor cells 250 may affect the data that corresponds to the state (e.g., the state "A"—a lower voltage state) stored in the specific cell 252. For example, a likelihood of erroneous data being stored in the specific cell 252 may be greater due to higher voltage states of the one or more of the neighbor cells 250 as compared to the lower voltage state stored in the specific cell 252. For example, as illustrated, because the memory cell 252 is surrounded by memory cells 256, 258, 262, 264, 266, 272, 274, and 276 (e.g., having states "F", "G", "F", "F", "G", "G", "G", "F", respectively—higher voltage states), it may be likely that the memory cell 252 was programmed to a lowest voltage state (e.g., state "Er") and has been disturbed to be in the state "A". If the one or more identified bits (e.g., a "0 1 1" value corresponding to the state "A") correspond to the disturb condition test pattern (e.g., a disturb condition test pattern corresponding to the states "F", "G", "F", "F", "G", "G", "G", "F" in the memory cells surrounding the memory cell 252), modified data may be generated by changing one or more of the identified bits (e.g., changing the "0 1 1" value corresponding to the state "A" to a "1 1 1" value corresponding to the state "Er"), and a second decode operation may be performed at the ECC hard bit decoder 128 of FIG. 1 using the modified data.

In another implementation, the controller 106 may receive a data read request from the host device 130 of FIG. 1 and may initiate a read operation to read data from the memory 104. For example, the controller 106 may receive a data read request from the host device 130 to read data from the middle page 214 of the word line 202, and data from a memory cell, as well as the states of one or more neighbor memory cells, may be read from the memory 104 and provided by the controller 106 to the ECC hard bit decoder 128. For example, when the data read request includes a request for data stored at the memory cell 222, the controller 106 may also initiate reads of one or more neighbor cells whose state value may be correlated to a disturb condition and may be used in comparison to one or more of the disturb condition test patterns 280-284. For example, the controller 106 may also read state values of cells sharing the same bit line 207 as the memory cell 222, state values of cells sharing the same word line 202 as the memory cell 222, or any combination thereof.

The controller 106 may initiate a first decode operation of the data read (e.g., including data corresponding to the state "A" read from the memory cell 222) at the ECC hard bit decoder 128. In response to the first decode operation indicating that the data read from the middle page 214 is uncorrectable, the controller 106 may identify one or more bits of the data (e.g., a bit read from the memory cell 222) that correspond to a disturb condition test pattern (e.g., by reading neighbor cells from the memory and comparing the states of the read memory cells to the disturb condition test pattern). The disturb condition test pattern may be based at least in part on a state of a second cell of the memory adjacent to a first cell of the memory, where the first cell stores one or more of the identified bits. For example, the disturb condition test pattern may represent state values of neighbor cells that have been determined to correspond to a disturb condition at the first cell. The first cell may be coupled to a first bit line and to a first word line, and the second cell may be coupled to the first bit line and to a second word line.

To illustrate, when the controller 106 reads the data stored in the memory cell 222 at the intersection of the word line 202 and the bit line 207, the controller 106 may also read state values of cells sharing the same bit line 207 as the memory cell 222, such as a first state value (e.g., state "G") of the memory cell 224 at the intersection of the word line 204 and the bit line 207. Because program disturbance effects resulting from programming nearby cells may be most likely to occur in a lower voltage state, and read disturbance effects resulting from reading nearby cells may be most likely to occur in a higher voltage state, the first state value (e.g., "G"—a higher voltage state) of the memory cell 224 may affect the data stored in the memory cell 222 (e.g., "A"—a lower voltage state).

Alternatively, or in addition, the disturb condition test pattern may be based at least in part on a state of a third cell, where the third cell is adjacent to the first cell, where the third cell is coupled to the first bit line and to a third word line, and where the first word line is located between the second word line and the third word line. To illustrate, in addition to reading the data stored in the memory cell 222 and the first state value of the memory cell 224, the controller 106 may also read the state value (e.g., state "G") of the memory cell 226 at the intersection of the word line 206 and the bit line 207 to determine whether data read from the memory cell 222 is likely to be subject to a disturb condition.

The controller 106 may be configured to compare the state value of the memory cell 222 and the first state value of the memory cell 224 to one or more of the disturb condition test patterns 280-284, and based on the comparison, the controller 106 may be configured to identify a bit error of the data corresponding to the memory cell 222 as corresponding to a disturb condition test pattern. As another example, the controller 106 may be configured to perform a second comparison that compares the state value of the memory cell 222, the first state value of the memory cell 224, and the second state value of the memory cell 226, to one or more of the disturb condition test patterns 280-284. The controller 106 may be configured to change a value of the one or more identified bits based on the second comparison.

To illustrate, when the controller 106 reads the data stored in the memory cell 222 and the first state value of the memory cell 224, the controller 106 may also read a state value (e.g., state "G") of the memory cell 226 at the intersection of the word line 206 and the bit line 207. The first state value (e.g., "G"—a higher voltage state) of the memory cell 224 and the second state value (e.g., "G"—a higher voltage state) may affect the data stored in the memory cell 222 (e.g., "A"—a lower voltage state). Accordingly, a likelihood of erroneous data being stored in the memory cell 222 may be greater due to the higher voltage states of the one or more adjacent neighbor memory cells 224 and 226 as compared to the lower voltage state stored in the memory cell 222. If the one or more identified bits (e.g., a "0 1 1" value corresponding to the state "A") correspond to the disturb condition test pattern (e.g., a disturb condition test pattern corresponding to the states "G A G" in the lower, middle, and upper pages 204, 202, and 206, respectively), modified data may be generated by changing one or more of the identified bits (e.g., changing the "0 1 1" value corresponding to the state "A" to a "1 1 1" value corresponding to the state "Er"), and a second decode operation may be performed at the ECC hard bit decoder 128 of FIG. 1 using the modified data.

As another example, a particular cell, such as the memory cell 232, may store one or more of the identified bits, and the disturb condition test pattern may be based at least in part on soft bits read from the memory cell 234 adjacent to and in the same word line 202 as the particular cell 232 and soft bits read from another memory cell 236 adjacent to and in the same word line 202 as the particular cell 232. The particular cell 232 may be between the memory cell 234 and the other memory cell 236.

For example, when the data read request requests data stored at the particular cell 232, the controller 106 may also initiate soft bit reads of one or more neighbor cells in the word line 202 whose state value may be correlated to a disturb condition and may be used in comparison to one or more of the disturb condition test patterns 280-284. For example, the controller 106 may also read soft bits of cells adjacent to and sharing the same word line 202 as the particular cell 232, such as the memory cell 234 and the memory cell 236.

The controller 106 may be configured to compare the soft bits read from the memory cells 234, 236 to one or more of the disturb condition test patterns 280-284, and based on the comparison, may change a value of the one or more identified bits. For example, soft bits read from the memory cell 234 having the state "G" and soft bits read from the memory cell 236 having the state "G" may indicate that the data stored in the memory cell 232 (e.g., having a state "A"—a lower voltage state) may be affected by the neighbor cells 234, 236. A likelihood of erroneous data being stored in the memory cell 232 may be greater due to the higher voltage states of the one or more adjacent neighbor memory cells 234 and 236 as compared to the lower voltage state stored in the memory cell 232. If the one or more identified bits correspond to a disturb condition test pattern, such as the second disturb condition test pattern 282, modified data may be generated, and a second decode operation may be performed at the ECC hard bit decoder 128 of FIG. 1 using the modified data.

As another example, the disturb condition test pattern may be based at least in part on a state of one or more neighbor cells 250 to a specific cell 252 that stores one or more of the identified bits. The specific cell 252 may be coupled to a particular bit line (e.g., the bit line 213) and to a particular word line (e.g., the word line 202), and a first neighbor cell 262 of the one or more neighbor cells 250 may be coupled to a first neighbor bit line (e.g., the bit line 211) and to a first neighbor word line (e.g., the word line 204). Alternatively, or in addition, a second neighbor cell 276 of the one or more neighbor cells 250 may be coupled to a second neighbor bit line (e.g., the bit line 215) and to a second neighbor word line (e.g., the word line 206). The particular word line 202 may be located between the first neighbor word line 204 and the second neighbor word line 206, and the particular bit line 213 may be located between the first neighbor bit line 211 and the second neighbor bit line 215.

A first group 254 of the one or more neighbor cells 250 may include a first plurality of neighbor cells, such as the neighbor cells 256 and 258. The first group 254 of neighbor cells may be coupled to the particular word line 202. A second group 260 of the one or more neighbor cells 250 may include a second plurality of neighbor cells, such as the neighbor cells 262, 264, and 266, that includes the first neighbor cell 262. The second group 260 may be coupled to the first neighbor word line 204. A third group 270 of the one or more neighbor cells 250 may include a third plurality of neighbor cells, such as the neighbor cells 272, 274, and 276, that includes the second neighbor cell 276. The third group 270 may be coupled to the second neighbor word line 206.

The controller 106 may be configured to compare the state values of one or more of the neighboring cells 250 to one or more of the disturb condition test patterns 280-284, and based on the comparison, the controller 106 may be configured to change a value of the one or more identified bits. To illustrate, when the controller 106 reads the data stored in the specific cell 252, the controller 106 may also read a state value of one or more of the neighbor cells 250. For example, the controller 106 may read data that corresponds to the state value "F" stored in the memory cell 256, data that corresponds to the state value "G" stored in the memory cell 258, data that corresponds to the state value "F" stored in the memory cell 262, data that corresponds to the state value "F" stored in the memory cell 264, data that corresponds to the state value "G" stored in the memory cell 266, data that corresponds to the state value "G" stored in the memory cell 272, data that corresponds to the state value "G" stored in the memory cell 274, and data that corresponds to the state value "F" stored in the memory cell 276, or any combination thereof.

The neighbor cells 250 may affect the data that corresponds to the state (e.g., the state "A"—a lower voltage state) stored in the specific cell 252. Accordingly, a likelihood of erroneous data being stored in the specific cell 252 may be greater due to the higher voltage states of the one or more of the neighbor cells 250 as compared to the lower voltage state stored in the specific cell 252. If the one or more identified bits correspond to the disturb condition test pattern, modified data may be generated, and a second decode operation may be performed at the ECC hard bit decoder 128 of FIG. 1 using the modified data.

By identifying bits that correspond to a disturb condition test pattern as likely to be erroneous after performing a first decode operation, the controller 106 may correct a sufficient number of erroneous bits in a subsequent decode operation to enable the controller 106 to successfully decode data read from the memory 104. For example, as illustrated, because the memory cell 252 (e.g., having a state "A"—a lower voltage state) is surrounded by memory cells 256, 258, 262, 264, 266, 272, 274, and 276 (e.g., having states "F", "G", "F", "F", "G", "G", "G", "F", respectively—higher voltage states), it may be likely that the memory cell 252 was programmed to a lowest voltage state (e.g., state "Er") and has been disturbed to be in the state "A". To illustrate, if the state "Er" corresponds to a bit value of "1 1 1", then an Er→A transition causes an error in the lower page 216, but not in the middle page 214 or in the upper page 212. If the lower page 216 of the word line 202 has a decoding failure, a bit from the memory cell 252 may be identified for changing or flipping. However, if the upper page 212 or the middle page 214 of the word line 202 has an ECC fail, the bit from the memory cell 252 may not be identified as likely to be subject to a disturb condition and a bit from another memory cell in the word line 202 may be identified for changing or flipping.

Figure 3:
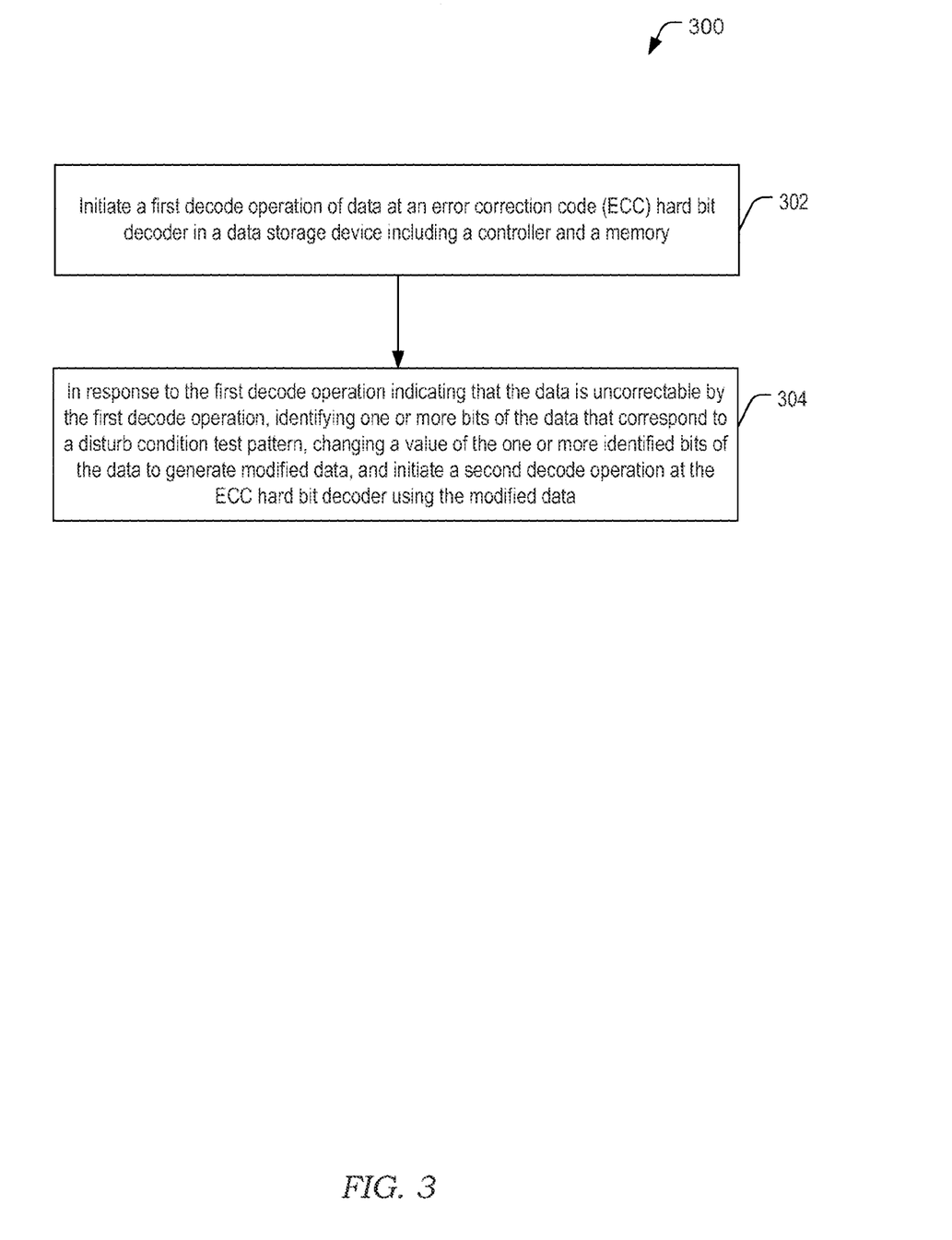
FIG. 3 is a flow diagram illustrating an embodiment of a method of decoding data that is subject to a disturb condition.

FIG. 3 is a flow diagram of a particular embodiment of a method 300 of decoding data that is subject to a disturb condition. The method 300 may be performed by the data storage device 102 of FIG. 1.

A first decode operation of data is initiated at an error correction code (ECC) hard bit decoder in a data storage device including a controller and a memory, at 302. For example, the controller 106 may read the first data 110 from the memory 104 and provide the first data 110 to the ECC hard bit decoder 128. The ECC hard bit decoder 128 may perform a first decode operation of the first data 110.

In response to the first decode operation indicating that the data is uncorrectable by the first decode operation, one or more bits of the data that correspond to a disturb condition test pattern may be identified, a value of the one or more identified bits of the data may be changed to generate modified data, and a second decode operation may be initiated at the ECC hard bit decoder using the modified data, at 304. For example, if the first decode operation determines that the first data 110 is uncorrectable, the states of neighboring memory cells may be compared to the disturb condition test pattern 122 and the modified data 126 may be generated based on the disturb condition test pattern 122. For example, the controller 106 may be configured to compare the state value of a particular memory cell and the state values of neighboring memory cells to the disturb condition test pattern 122. Based on the comparison, the controller 106 may be configured to identify a bit error of the data corresponding to the particular memory cell as corresponding to the disturb condition test pattern and generate the modified data 126 by changing a value of one or more identified bits of the data in the particular memory cell.

To illustrate, the disturb detector/hard bit updater 120 may identify one or more bits of the first data 110 that correspond to the disturb condition test pattern 122 and may change a value of the one or more identified bits of the first data 110 to generate the modified data 126. The second decode operation may be performed at the ECC hard bit decoder 128 using the modified data 126.

The disturb condition test pattern may be based on a read disturb condition or a program disturb condition. The disturb condition test pattern may be empirically determined to indicate the disturb condition or may be determined using physical models. For example, the disturb condition test patterns 280-284 of FIG. 2 may correspond to the first group of memory cells 220 of FIG. 2, the second group of memory cells 230, or the third group of memory cells 240, respectively, and may be selected by the controller 106 from the table of patterns 210.

For example, the memory cell 222 may store one or more of the identified bits, and the first disturb condition test pattern 280 may be based at least in part on a state of the memory cell 224. Alternatively, or in addition, the first disturb condition test pattern 280 may be based at least in part on a state of the memory cell 226.

As another example, the particular cell 232 may store one or more of the identified bits, and the second disturb condition test pattern 282 may be based at least in part on soft bits read from the memory cell 234 and soft bits read from the other memory cell 236.

As another example, the specific cell 252 may store one or more of the identified bits, and the third disturb condition test pattern 284 may be based at least in part on a state of one or more of the neighbor cells 250 to the specific cell 252.

Identifying bits that correspond to a disturb condition test pattern as likely to be erroneous after performing a first decode operation may enable the controller 106 to correct a sufficient number of erroneous bits in a subsequent decode operation and to successfully decode data read from the memory 104.

Although various components depicted herein are illustrated as block components and described in general terms, such components may include one or more microprocessors, state machines, or other circuits configured to enable a data storage device, such as the data storage device 102 of FIG. 1, to perform the particular functions attributed to such components, or any combination thereof. For example, the controller 106 of FIG. 1 and FIG. 2 may represent physical components, such as controllers, processors, state machines, logic circuits, or other structures to instruct the disturb detector/hard bit updater 120 to identify the one or more bits of the data that correspond to the disturb condition test pattern and to generate the modified data by changing the value of the one or more identified bits of the data.

The controller 106 may be implemented using a microprocessor or microcontroller programmed to generate control information and to instruct the disturb detector/hard bit updater 120. In a particular embodiment, the controller 106 includes a processor executing instructions that are stored at the memory 104. Alternatively, or in addition, executable instructions that are executed by the processor may be stored at a separate memory location that is not part of the non-volatile memory 104, such as at a read-only memory (ROM).

In a particular embodiment, the data storage device 102 may be a portable device configured to be selectively coupled to one or more external devices. For example, the data storage device 102 may be a removable device such as a universal serial bus (USB) flash drive or removable memory card. However, in other embodiments, the data storage device 102 may be attached or embedded within one or more host devices, such as within a housing of a portable communication device. For example, the data storage device 102 may be within a packaged apparatus, such as a wireless telephone, a personal digital assistant (PDA), a gaming device or console, a portable navigation device, a computer, or other device that uses internal non-volatile memory. In a particular embodiment, the data storage device 102 includes a non-volatile memory, such as a Flash memory (e.g., NAND, NOR, Multi-Level Cell (MLC), Divided bit-line NOR (DINOR), AND, high capacitive coupling ratio (HiCR), asymmetrical contactless transistor (ACT), or other Flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   in a data storage device including a controller, a memory, and a second memory, performing, by the controller:
      storing, into the second memory, data read from a first word line of the memory during a first read operation;
      initiating a first decode operation of the data at an error correction code (ECC) hard bit decoder; and
      in response to the first decode operation initiated at the ECC hard bit decoder indicating that the data is uncorrectable by the first decode operation:
         identifying one or more bits of the data that correspond to a disturb condition test pattern, wherein the disturb condition test pattern is based at least in part on a state of one or more neighbor cells to a particular cell that stores the one or more identified bits;
         changing a value of the one or more identified bits of the data stored in the second memory to generate first modified data in the second memory; and
         initiating a second decode operation at the ECC hard bit decoder using the first modified data; and in response to the second decode operation indicating that the first modified data is uncorrectable by the second decode operation:

initiating a second read operation of a second word line of the memory to determine second states of one or more cells of the second word line;

identifying a second bit of the data that corresponds to a second disturb condition test pattern based on at least one state of the second states; and     changing a value of the second bit of the data to generate second modified data.

2. The method of claim 1, wherein the controller imposes a limit to a number of successive decode operations that may be attempted, and wherein the limit is associated with a timeout value.

3. The method of claim 1, wherein:

the disturb condition test pattern is based at least in part on a state of a first cell of the memory adjacent to the particular cell of the memory, the particular cell is coupled to a first bit line and to the first word line, and the first cell is coupled to the first bit line and to a third word line.

4. The method of claim 3, wherein the disturb condition test pattern is based at least in part on a state of a second cell, wherein the second cell is adjacent to the particular cell.

5. The method of claim 1, wherein the disturb condition test pattern is further based at least in part on soft bits read from a first cell adjacent to and in a same word line as the particular cell and soft bits read from a second cell adjacent to and in the same word line as the particular cell, wherein the particular cell is between the first cell and the second cell.

6. The method of claim 1, further comprising:

accessing the disturb condition test pattern, wherein the one or more bits of the data are identified based on the disturb condition test pattern, wherein the disturb condition test pattern corresponds to the particular cell, and wherein the particular cell and the one or more neighbor cells are included in a same block of the memory; and sending the modified data to the ECC hard bit decoder prior to initiating the second decode operation.

7. The method of claim 1, wherein the particular cell is coupled to a particular bit line and to a particular word line, and wherein a first neighbor cell of the one or more neighbor cells is coupled to a first neighbor bit line and to a first neighbor word line.

8. The method of claim 7, wherein a second neighbor cell of the one or more neighbor cells is coupled to a second neighbor bit line and to a second neighbor word line, wherein the particular word line is located between the first neighbor word line and the second neighbor word line, and wherein the particular bit line is located between the first neighbor bit line and the second neighbor bit line.

9. The method of claim 8, wherein a first group of the one or more neighbor cells includes a first plurality of neighbor cells, wherein the first group is coupled to the particular word line, wherein a second group of the one or more neighbor cells includes a second plurality of neighbor cells that includes the first neighbor cell, wherein the second group is coupled to the first neighbor word line, and wherein a third group of the one or more neighbor cells includes a third plurality of neighbor cells that includes the second neighbor cell, wherein the third group is coupled to the second neighbor word line.

10. The method of claim 1, further comprising:

initiating one or more read operations associated with the one or more neighbor cells, wherein the data and the first modified data are stored concurrently at the second memory.

11. The method of claim 1, wherein the disturb condition test pattern is based on a program disturb condition or a read disturb condition, wherein the first word line includes the particular cell and the one or more neighboring cells, and further comprising initiating a third decode operation at the ECC hard bit decoder using the second modified data.

12. The method of claim 1, further comprising generating, by the ECC hard bit decoder, an indication that the data is uncorrectable by the first decode operation, wherein the controller identifies the one or more bits of the data that correspond to the disturb condition test pattern in response to the indication.

13. The method of claim 1, wherein the memory is a flash memory that includes multi-level cells.

14. A data storage device comprising:

a memory;

a second memory; and a controller configured to:

store, into the second memory, first data read from one or more first cells of the memory during a first read operation;

initiate a first decode operation of the first data at an error correction code (ECC) hard bit decoder; and     in response to the first decode operation initiated at the ECC hard bit decoder indicating that the first data is uncorrectable by the first decode operation:

initiate identification of one or more first bits of the first data that correspond to a disturb condition test pattern, wherein the disturb condition test pattern is based at least in part on a state of one or more neighbor cells to a particular cell of the one or more first cells that stores the one or more identified first bits;

initiate changing of a value of the one or more identified first bits of the first data stored in the second memory to generate first modified data in the second memory; and         initiate a second decode operation at the ECC hard bit decoder using the first modified data; and in response to the second decode operation initiated at the ECC hard bit decoder indicating that the first modified data is uncorrectable by the second decode operation:

initiate a second read operation to determine one or more states of one or more second cells of the memory, wherein the one or more second cells are different than the one or more first cells; and     initiate changing of a value of a second bit of the first data to generate second modified data, the second bit of the first data identified based at least in part on a state of the one or more states of the one or more second cells of the memory.

15. The data storage device of claim 14, wherein:

the controller is configured to impose a limit to a number of successive decode operations that may be attempted, and the limit is associated with a timeout value or a decode operation threshold.

16. The data storage device of claim 15, wherein the controller is further configured to select the disturb condition test pattern from a table, and wherein the table is in the controller of the data storage device or in the memory of the data storage device.

17. The data storage device of claim 14, wherein the controller includes a disturb detector that is distinct from the ECC hard bit decoder, wherein the disturb detector is configured to, in response to the first decode operation indicating that the first data is uncorrectable by the first decode operation, initiate identification of the one or more first bits of the first data, initiate changing of the one or more identified first bits, and send the first modified data to the ECC hard bit decoder.

18. The data storage device of claim 14, wherein:
the ECC hard bit decoder is configured to generate an indication that the first data is uncorrectable by the first decode operation, and
the controller is further configured to initiate the identification of the one or more first bits of the first data that correspond to the disturb condition test pattern in response to the indication.

19. The data storage device of claim 14, wherein the one or more neighbor cells include a first neighbor cell of the memory adjacent to the particular cell of the memory.

20. The data storage device of claim 19, wherein the particular cell is coupled to a first bit line and to a first word line, and wherein the first neighbor cell is coupled to the first bit line and to a second word line.

21. The data storage device of claim 20, wherein the disturb condition test pattern is based at least in part on a state of a second neighbor cell, wherein the second neighbor cell is adjacent to the particular cell, wherein the second neighbor cell is coupled to the first bit line and to a third word line, and wherein the first word line is located between the second word line and the third word line.

22. The data storage device of claim 14, wherein the disturb condition test pattern is based at least in part on soft bits read from a first neighbor cell adjacent to and in a same word line as the particular cell and soft bits read from a second neighbor cell adjacent to and in the same word line as the particular cell, wherein the particular cell is between the first neighbor cell and the second neighbor cell.

23. The data storage device of claim 14, wherein the one or more neighbor cells include a first neighbor cell of the memory that is not physically adjacent to the particular cell of the memory, and wherein the disturb condition test pattern corresponds to the particular cell.

24. The data storage device of claim 14, wherein the particular cell is coupled to a particular bit line and to a particular word line, and wherein a first neighbor cell of the one or more neighbor cells is coupled to a first neighbor bit line and to a first neighbor word line.

25. The data storage device of claim 24, wherein a second neighbor cell of the one or more neighbor cells is coupled to a second neighbor bit line and to a second neighbor word line, wherein the particular word line is located between the first neighbor word line and the second neighbor word line, and wherein the particular bit line is located between the first neighbor bit line and the second neighbor bit line.

26. The data storage device of claim 25, wherein a first group of the one or more neighbor cells includes a first plurality of neighbor cells, wherein the first group is coupled to the particular word line, wherein a second group of the one or more neighbor cells includes a second plurality of neighbor cells that includes the first neighbor cell, wherein the second group is coupled to the first neighbor word line, and wherein a third group of the one or more neighbor cells includes a third plurality of neighbor cells that includes the second neighbor cell, wherein the third group is coupled to the second neighbor word line.

27. The data storage device of claim 14, wherein the controller includes a disturb detector/hard bit updater that is configured to identify the one or more first bits of the first data that correspond to the disturb condition test pattern and to generate the first modified data by changing the value of the one or more identified first bits of the first data.

28. The data storage device of claim 14, wherein the disturb condition test pattern is based on:
a read disturb condition, or
a program disturb condition.

* * * * *